United States Patent
Matsui

(10) Patent No.: US 7,102,735 B2
(45) Date of Patent: Sep. 5, 2006

(54) SUBSTRATE HOLDING DEVICE, SEMICONDUCTOR MANUFACTURING APPARATUS AND DEVICE MANUFACTURING METHOD

(75) Inventor: Shin Matsui, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/220,677

(22) Filed: Sep. 8, 2005

(65) Prior Publication Data

US 2006/0033904 A1   Feb. 16, 2006

Related U.S. Application Data

(62) Division of application No. 10/931,984, filed on Sep. 2, 2004, now Pat. No. 6,982,784, which is a division of application No. 09/799,060, filed on Mar. 6, 2001, now Pat. No. 6,862,080.

(30) Foreign Application Priority Data

Mar. 10, 2000  (JP)  ............... 2000-066378
Feb. 16, 2001  (JP)  ............... 2001-040169

(51) Int. Cl.
 G03B 27/58   (2006.01)
 G03B 27/62   (2006.01)
(52) U.S. Cl. .......................... 355/72; 355/75
(58) Field of Classification Search ............... 355/30, 355/53, 72–76; 310/10, 12; 378/34, 35
See application file for complete search history.

(56) References Cited

U.S. PATENT DOCUMENTS

| | | | |
|---|---|---|---|
| 4,278,348 A | 7/1981 | Funk et al. | 355/73 |
| 4,601,560 A | 7/1986 | Isohata et al. | 353/122 |
| 4,755,747 A | 7/1988 | Sato | 324/158 F |
| 4,869,481 A | 9/1989 | Yabu et al. | 269/21 |
| 5,220,171 A | 6/1993 | Hara et al. | 250/443.1 |
| 5,329,126 A | 7/1994 | Amemiya et al. | 250/453.11 |
| 5,382,311 A | 1/1995 | Ishikawa et al. | 156/345 |
| 5,409,348 A | 4/1995 | Suzuki | 414/786 |
| 5,409,384 A * | 4/1995 | Green et al. | 439/67 |
| 5,471,279 A | 11/1995 | Takizawa | 355/73 |
| 5,706,843 A | 1/1998 | Matsuo | 134/153 |
| 5,803,797 A | 9/1998 | Piper | 451/182 |
| 5,981,966 A | 11/1999 | Honma | 250/559.33 |
| 5,999,589 A | 12/1999 | Chiba et al. | 378/34 |
| 6,862,080 B1 | 3/2005 | Matsui | 355/72 |
| 6,982,784 B1 * | 1/2006 | Matsui | 355/72 |
| 6,992,780 B1 * | 1/2006 | Sentoku et al. | 356/620 |
| 2002/0176096 A1 | 11/2002 | Sentoku et al. | 356/620 |

FOREIGN PATENT DOCUMENTS

| | | |
|---|---|---|
| JP | 7-130637 | 5/1995 |
| JP | 9-283609 | 10/1997 |
| JP | 2748181 | 2/1998 |
| WO | WO 99/34412 | 7/1999 |

OTHER PUBLICATIONS

European Search Report dated Dec. 6, 2005, issued in corresponding European patent application No. EP 01 30 2152, forwarded in a Communication dated Dec. 15, 2005.

* cited by examiner

Primary Examiner—Henry Hung Nguyen
(74) Attorney, Agent, or Firm—Fitzpatrick, Cella, Harper & Scinto

(57) ABSTRACT

A substrate holding device includes a base member capable of removably holding a plate having a contact member to come into contact with a substrate, and a sensor that identifies an identification sign provided on the plate.

5 Claims, 10 Drawing Sheets

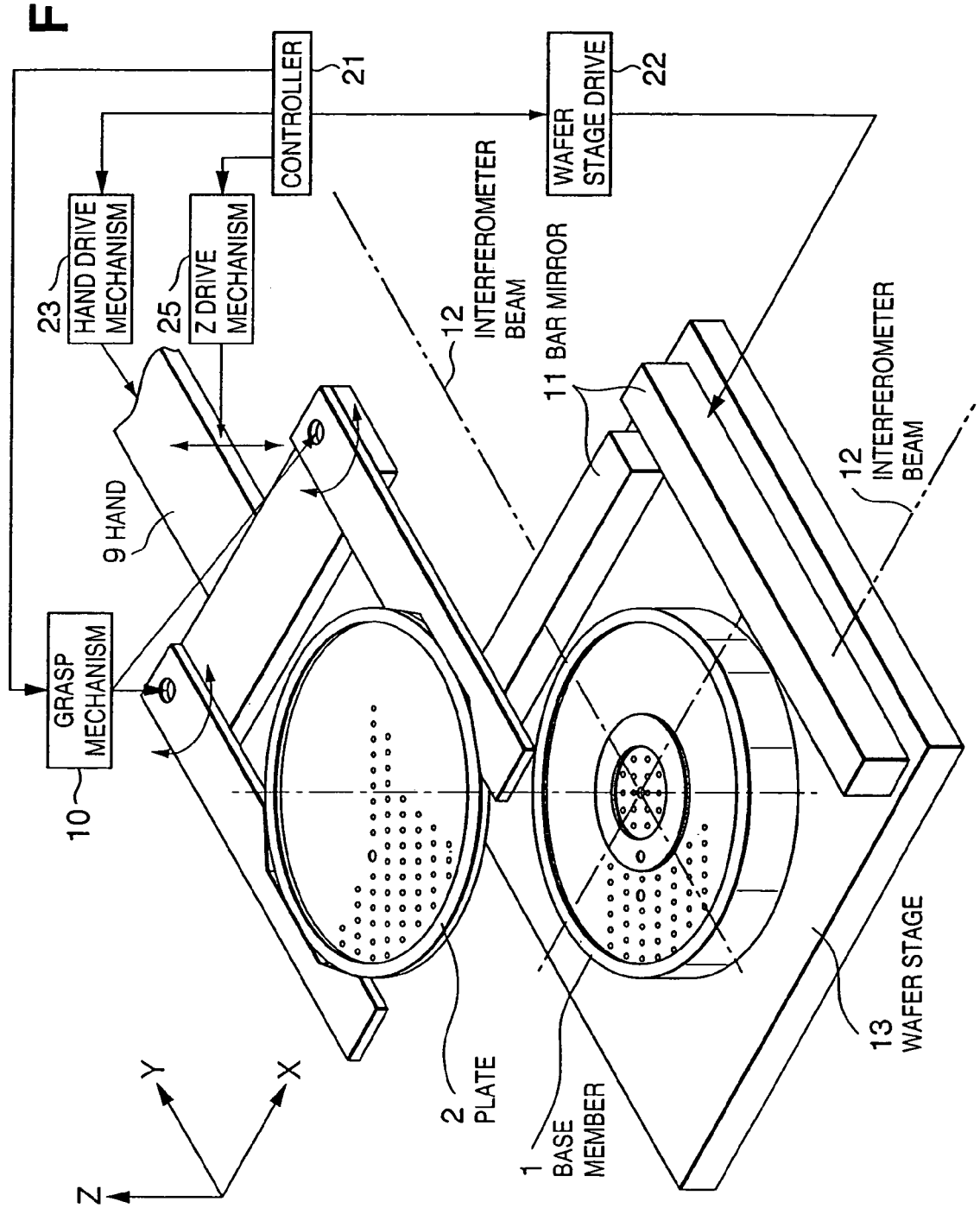

SUBSTRATE HOLDING DEVICE, SEMICONDUCTOR MANUFACTURING APPARATUS AND DEVICE MANUFACTURING METHOD

This application is a divisional application of U.S. patent application Ser. No. 10/931,984, filed Sep. 2, 2004 now U.S. Pat. No. 6,982,784, which is a divisional of U.S. patent application Ser. No. 09/799,060, filed Mar. 6, 2001, now U.S. Pat. No. 6,862,080, which issued on Mar. 1, 2005.

FIELD OF THE INVENTION

The present invention relates to a substrate holding device for holding a substrate (wafer) and an aligner or a semiconductor device manufacturing method using the substrate holding device.

DESCRIPTION OF THE RELATED ART

With the advance of semiconductor device miniaturization on the micro level, attachment of foreign materials to the rear surface of a semiconductor substrate such as a wafer, contamination of a wafer chuck, and the like, causes defects of semiconductors and seriously degrades productivity. In a semiconductor fabrication process, to prevent attachment of foreign materials to the rear surface of a semiconductor substrate, on the substrate side, cleaning, which is called a back rinse, is performed, and on the fabrication apparatus side, the shape, material, and the like, of the chuck are improved, so as to prevent attachment of foreign materials.

However, as the rear surface of a semiconductor substrate is handled upon transfer, a complete prevention measure has not been found so far.

In a semiconductor substrate process, most of foreign materials attached to the wafer chuck of an aligner are photosensitive material (photoresist) attached to the rear surface of the semiconductor substrate. The photosensitive material attached to the chuck solidifies on the wafer chuck. Further, floating dust in an atmosphere around the apparatus may be accumulated.

A problem occurs in the semiconductor fabrication process especially when the above-described solidified photosensitive material attaches to the chuck. This cannot be removed by a simple cleaning operation.

To remove the solid foreign material attached to the chuck, it is necessary to remove the wafer chuck from the apparatus and scrape the material away with a sharp-edged tool. However, if a knife-edged cutlery, a file, or the like, is used, the surface of the wafer chuck requiring 0.1 μm order flatness precision may be damaged or the surface precision may be degraded. Accordingly, for wafer chuck cleaning, a special tool is made as a flat plate with a surface precision approximately the same as that of the wafer chuck, having plural grooved sharp edges, and the grooved surface is brought into contact with the chuck to be cleaned, such that the foreign material attached to the chuck surface is scraped away.

FIG. 10 shows a conventional wafer chuck (Publication of Japanese Patent No. 2748181).

In FIG. 10, reference numeral 115 denotes a wafer chuck; and 116, suction grooves to suction-hold almost the entire surface of a wafer. As shown in this figure, generally, a conventional wafer chuck has a thickness of several mm to several tens of mm. This thickness is the minimum thickness necessary to maintain the flatness of the chuck. An extremely thin wafer chuck cannot be made without difficulty.

At present, in the semiconductor fabrication process, a maintenance operator manually removes a substrate holding unit (wafer chuck) from the apparatus and performs cleaning at regular intervals (or at irregular intervals). However, it takes much time for chuck exchange, or the apparatus must be stopped for a predetermined period due to the problem of temperature stability of the apparatus, or the like. This problem is one of the factors of degradation of productivity.

Further, as one prevention measure against the problem, means for cleaning the wafer chuck on the apparatus has been proposed (Japanese Patent Laid-Opened No. 7-130637). However, it cannot be considered to be the best measure from the viewpoint of preservation of a clean environment in the apparatus.

SUMMARY OF THE INVENTION

The present invention has been made in consideration of the above problems of the conventional techniques, and has as its object to provide a semiconductor manufacturing apparatus which enables simple attachment/removal of substrate holding means such as a chuck and cleaning of the substrate holding means, and which attains high productivity.

According to the present invention, the foregoing object is attained by providing a substrate holding device comprising a base member capable of removably holding a plate having a contact member to come into contact with a substrate, a first attraction mechanism that attracts the substrate onto the plate in a status in which the plate is held on the base member, and a second attraction mechanism that attracts the plate onto the base member.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a perspective view showing the structure of a substrate conveyance device according to the first embodiment;

DETAILED DESCRIPTION OF THE PREFERRED EMBODIMENTS

Preferred embodiments of the present invention will now be described in detail in accordance with the accompanying drawings.

<First Embodiment>

Figure 1:
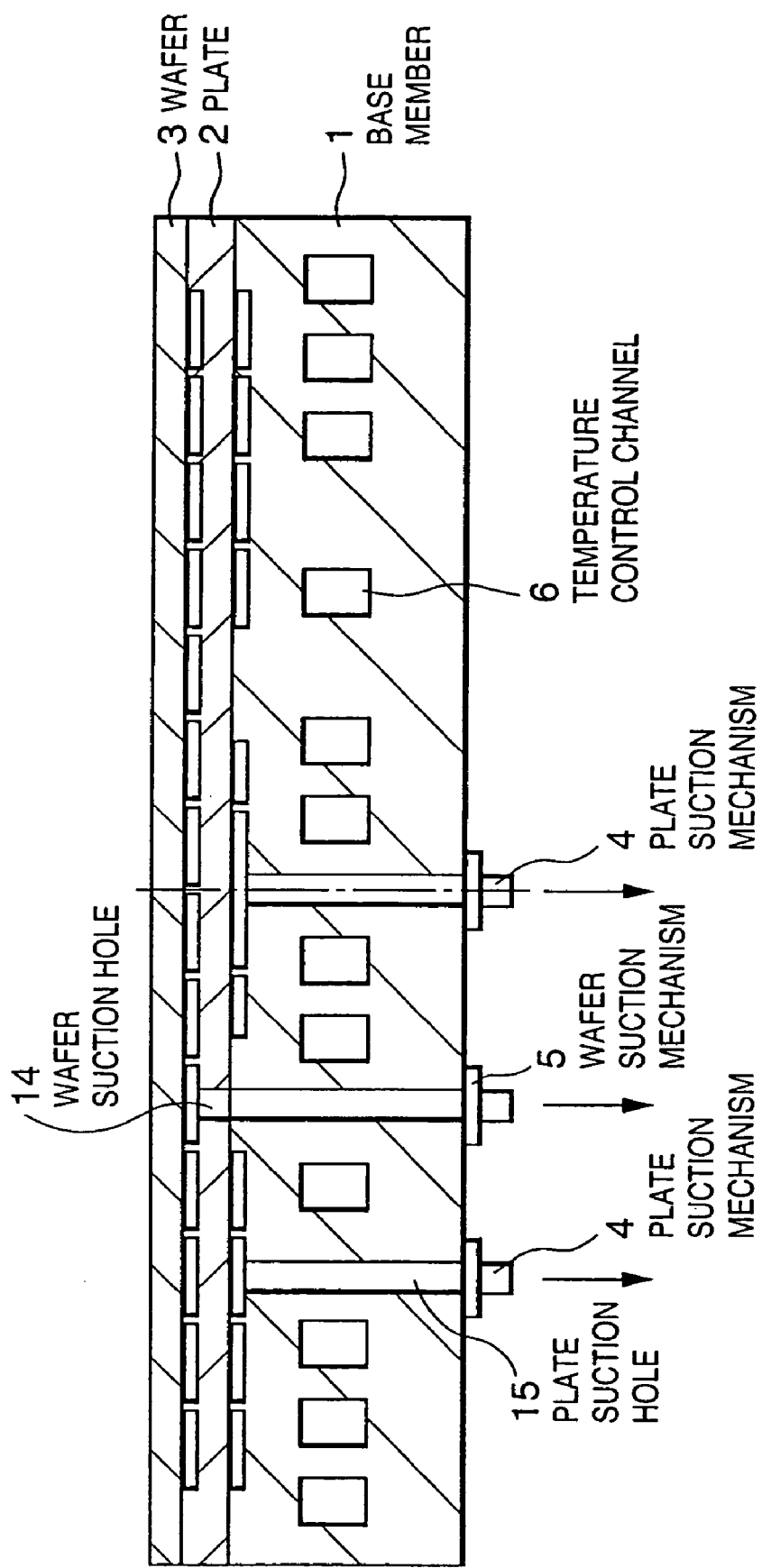
FIG. 1 is a cross-sectional view of a substrate holding device according to a first embodiment of the present invention.
Figure 2:
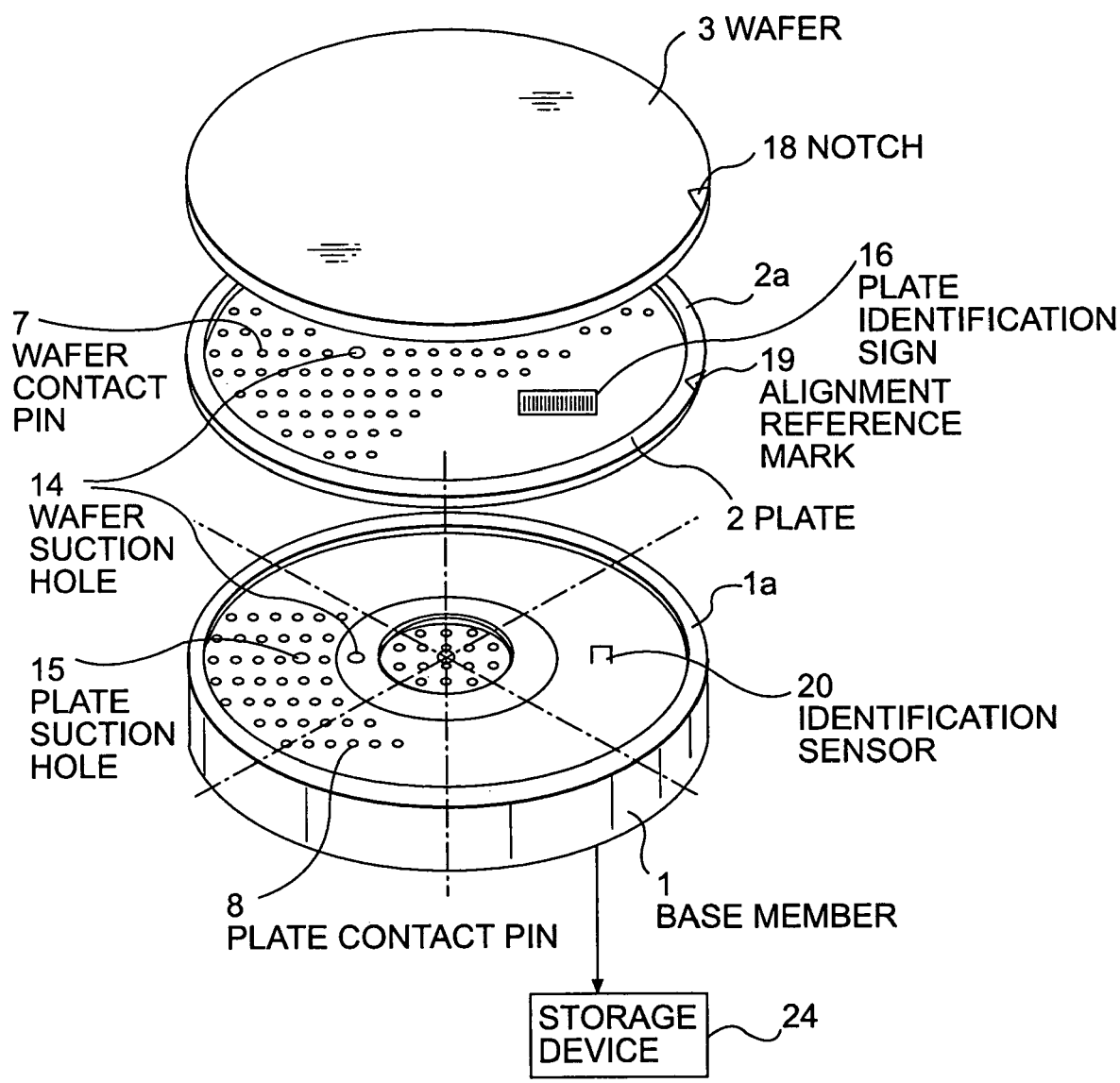
FIG. 2 is an exploded perspective view showing the structure of the substrate holding device according to the first embodiment.

FIG. 1 is a cross-sectional view showing the structure of a substrate holding device (wafer chuck) of a semiconductor manufacturing apparatus according to a first embodiment of the present invention. FIG. 2 is an exploded perspective view showing respective parts of the substrate holding device in FIG. 1.

The substrate holding device of the present embodiment is held on a drive mechanism, called a wafer stage, to sequentially transfer a circuit pattern on a reticle onto a semiconductor substrate (wafer). The wafer stage is capable of positioning in XYZ translation directions and XYZ axial rotation directions by a drive mechanism. Note that other functions, other than the substrate holding device, are omitted.

Numeral 1 denotes a base member fixed on the wafer stage (not shown). The base member 1 has a temperature control channel 6 to maintain a constant temperature of the member, and a temperature control medium is circulated through the channel. Note that in a case in which the temperature of the substrate holding base is increased by heat upon exposure or heat from the drive mechanism, a coolant is used. Further, as the temperature control medium, pure water, oil, or the like, is used.

Numeral 2 denotes a plate held on the base member 1, for directly holding a wafer 3. Upon chuck cleaning, only the plate 2 is removed and is cleaned. This operation will be described in detail later.

The plate 2 is vacuum-sucked on the base member 1 by negative pressure in a gap between the base member 1 and the plate 2 caused by a plate suction mechanism 4. For this purpose, the base member 1 has a plate suction hole 15.

Numeral 5 denotes a wafer suction mechanism to vacuum-suck the wafer on the plate 2. The wafer suction mechanism 5 is provided on the base member 1. Note that as a piping from the wafer suction mechanism 5 to the wafer, a wafer suction hole 14 is formed through the base member 1 and the plate 2 for holding the wafer 3 on the plate 2 by vacuum suction. That is, the plate 2 is placed on the base member 1 while the plate is aligned with the base member such that the suction hole provided in the plate 2 and the suction hole provided in the base member 1 are aligned with each other.

Even in a state in which the wafer is not placed on the plate 2, it is preferable that the plate 2 is sucked to the base member 1. For this purpose, in the present embodiment, the plate suction mechanism 4 and the wafer suction mechanism 5 function independently of each other.

In the present embodiment, the vacuum suction mechanism is used for holding the wafer 3 and the plate 2. However, the present invention is not limited to the vacuum suction mechanism, but any other holding mechanism, such as an electrostatic chuck or a mechanical chuck, can be used to obtain a similar advantage. In the use of the electrostatic chuck to hold the wafer 3, the plate 2 is placed on the base member 1 while the plate is aligned with the base member such that an electrode provided in the plate 2 and an electrode provided in the base member 1 are aligned with each other.

Numeral 7 denotes wafer contact pins for holding the wafer 3 on the plate 2. Further, numeral 2a denotes a ring-shaped contact member provided on a rim of the plate 2. The wafer 3 is supported by the contact member 2a and the pins 7, and is flat-corrected. Numeral 8 denotes plate contact pins as contact members for holding the plate 2 on the base member 1. Numeral 1a denotes a ring-shaped contact member provided on a rim of the base member 1. The plate 2 is supported by the contact member 1a and the pins 8.

In the present embodiment, to reduce the footprint and to avoid attachment of dust, the pin-shaped projections are used as the respective contact members. Note that the contact members are not limited to the pin-shaped projections, but any other members, such as ring-shaped projections, may be used as long as they attain a similar advantage. Further, even if the projections on the plate are pin-shaped projections, ring-shaped projections may be used on the base member.

Figure 3A:
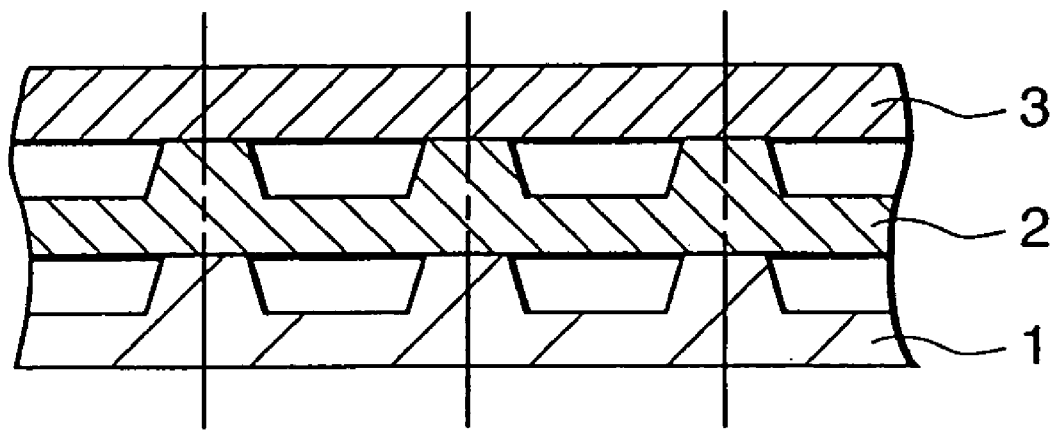
FIGS. 3A and 3B are explanatory views showing the positional relation between a projection of a plate and that of a base member.
Figure 3B:
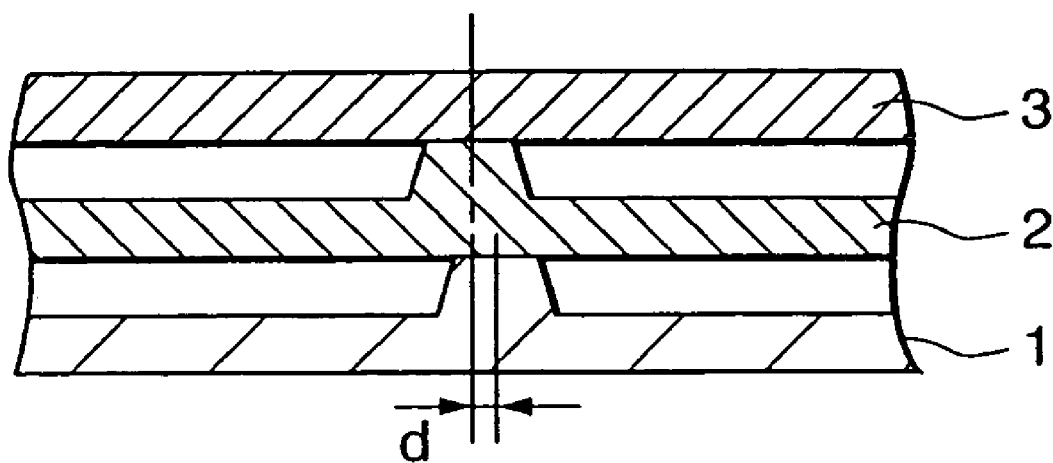

FIG. 3A shows the positional relation between the pins 7 provided on the plate 2 and the pins 8 provided on the base member 1. FIG. 3B shows a positional shift amount d between the central axis of the projection on the plate 2 (e.g., pin 7) and that of the projection on the base member 1 (e.g., pin 8).

It is impossible to form the plate 2 as a complete solid body. The plate 2 has a characteristic as an elastic body. Accordingly, when negative pressure occurs between the base member 1 and the plate 2 or between the plate 2 and the wafer 3, for example, the plate 2 is elastically deformed. However, even when the plate 2 is elastically deformed, the flatness of the surface of the pins 7 holding the wafer 3 must be maintained so as to flat-correct the wafer 3.

It is desirable that the projections on the base member 1 (e.g., pins 8) [are] be provided under projections of the plate 2 (e.g., pins 7) as shown in FIG. 3A.

That is, it is desirable that, as the positional relation between the projections on the plate 2 and those on the base member 1, they are coaxially arranged as much as possible. Here, "coaxial" does not means complete coaxial positioning, but positioning such that the degradation of flatness caused in the plate 2 due to the positional shift d is within an allowable range. For example, if the positional shift d is equal to or less than 5 mm, the projections are coaxially positioned, and if the positional shift d is equal to or less than 1 mm, the projections are more preferably coaxially positioned, and further, if the positional shift d is equal to or less than 0.5 mm, the projections are further preferably coaxially positioned. In any case, if the flatness of the plate 2 is within the allowable range, the projections are in the "coaxial" relation. Further, it may be arranged such that the projections are in the "coaxial" relation if the central axis of the projection on the plate 2 is within the area of the projection of the base member 1.

Further, it is preferable that the projections on the base member 1 are arranged under all the projections on the plate 2. Note that the projections are not necessarily arranged in this manner. It is preferable that the projections on the base member 1 are provided under 90% of the projections on the plate 2.

Note that in the use of an electrostatic chuck, the above advantage can be similarly obtained even if the projections are not used.

Next, the structure for plate conveyance to automatically attach/remove the plate to/from the base member by the above construction will be described with reference to FIG. 4.

Numeral 13 denotes the wafer stage which is not shown in FIGS. 1 and 2. The wafer stage 13 is capable of positioning in the XYZ translation directions and the XYZ axial rotation directions by a wafer stage device mechanism 22. A bar mirror 11 as well as the above-described wafer chuck is mounted on the wafer stage 13. The bar mirror 11 is irradiated with a laser beam (interferometer beam) 12, thereby the position of the reflection surface of the bar mirror 11 is measured. That is, the position of the wafer stage 13 is measured by a laser interferometer (not shown) and the bar mirror 11. The result of the measurement is inputted into a controller 21. The controller 21 outputs a drive signal to the wafer stage drive mechanism 22 based on the input position information of the wafer stage 13. The drive mechanism 22 drives the wafer stage 13 based on the drive signal.

Numeral 9 denotes a hand for conveyance used for providing/collecting the wafer 3 and for providing/collecting the plate 2. The hand 9 grasps a side surface of the wafer 3 or the plate 2 by a grasp mechanism 10 included in the end of the hand 9. The grasp mechanism 10 is controlled based on a signal from the controller 21. Further, a Z drive mechanism 25 drives the hand 9 in the Z direction. The Z drive mechanism 25 is controlled based on a signal from the controller 21. By using the Z drive mechanism 25, the wafer or plate grasped by the hand 9 can be placed on the base member, or the like, or the placed wafer or plate can be removed. In the present embodiment, an edge portion of the wafer 3 and that of the plate 2 is grasped. Note that pickup/placement upon conveyance is not limited to the grasp of the side surface. For example, it may be arranged such that the wafer 3 is lifted in the Z direction from the plate 2 or the plate 2 is lifted in the Z direction from the base member 1, and the hand holds the bottom surface of the wafer 3 or the plate 2.

Note that a hand drive mechanism 23 is provided to drive the hand 9 in the Z or Y direction to, e.g., convey the wafer 3 and the plate 2 to the outside of the exposure chamber. The drive mechanism 23 drives the hand 9 based on a signal from the controller 21.

Figure 5A:
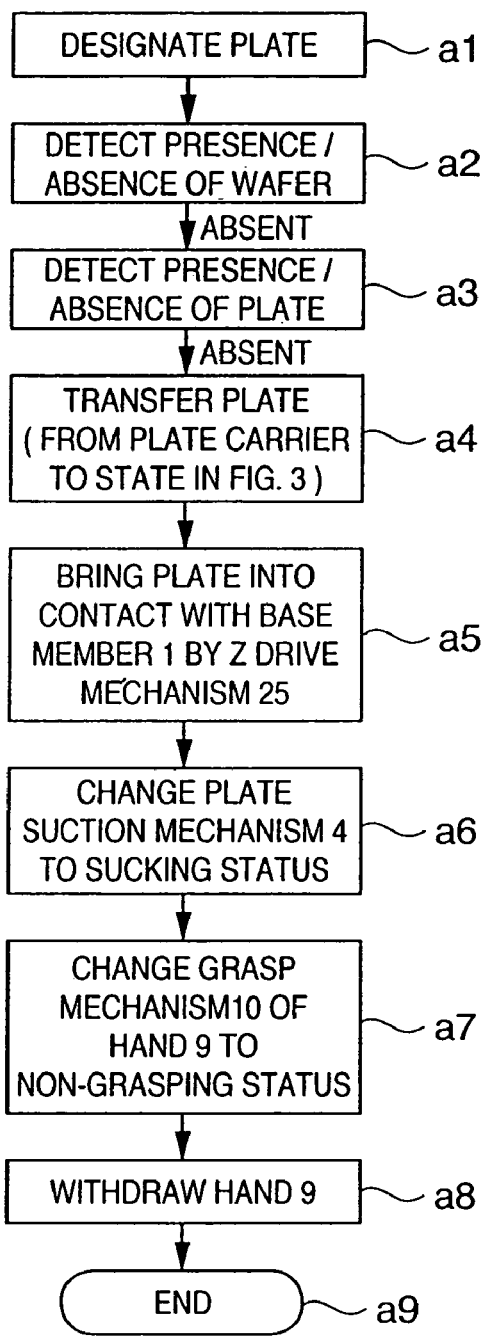
FIGS. 5A and 5B are flowcharts showing a sequence upon attachment of the plate and a sequence upon removal of the plate, according to the first embodiment.
Figure 5B:
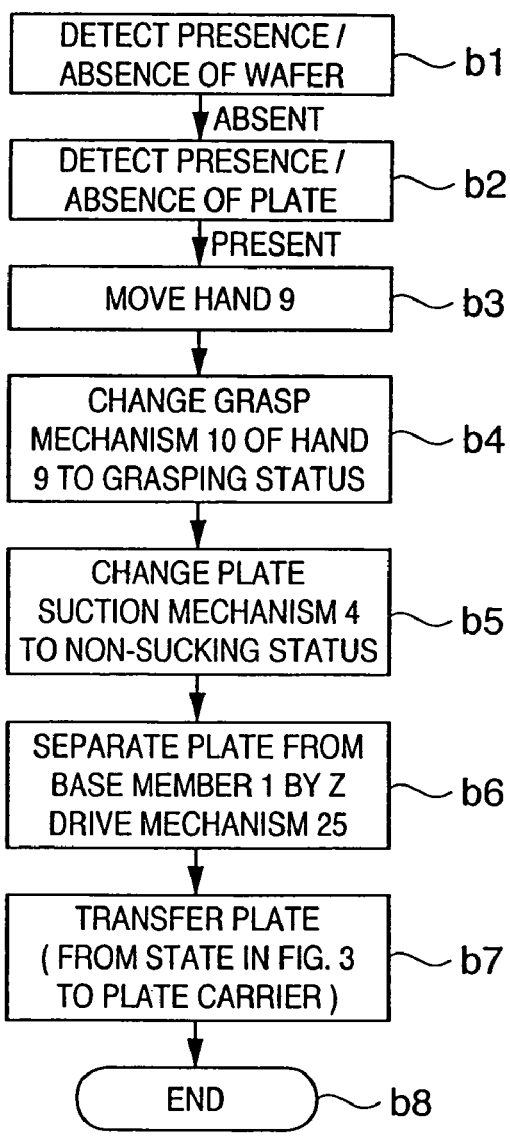

FIG. 5A shows a sequence upon attachment of the plate 2 in the above construction, and FIG. 5B shows a sequence upon removal of the plate. The controller 21 controls necessary drive mechanisms, and the like, based on the sequences.

In an initial status, the plate 2 and the wafer 3 are not placed on the base member 1. To set the plate 2 from this initial status, first, a plate to be attached is designated from plural plates (a1). The designation of the plate is made, e.g., by inputting a signal into the controller 21 or based on stored exposure information. Then, it is checked that the plate 2 and the wafer 3 are not placed on the base member (a2 and a3). The checking operation is made based on, e.g., signals from pressure sensors provided in the plate suction mechanism 4 and the wafer suction mechanism 5. Thereafter, the designated plate is conveyed from a plate carrier (not shown) (also usable as a wafer carrier) to the status as shown in FIG. 4 (a4).

When the plate 2 has been conveyed to a position above the base member 1, the plate 2 is moved downward and brought into contact with the base member 1 by the Z drive mechanism 25 (a5). When the contact between the plate 2 and the base member 1 has been checked, the plate suction mechanism 4 is changed to a sucking status, to suction-hold the plate 2 and the base member 1 (a6). The suction between the base member 1 and the plate 2 is made by vacuum suction here.

When the suction status has been checked, the hand 9 changes the grasp mechanism 10 to a non-suction status (a7), to withdraw the hand 9 (a8). Thus, the placement of the plate is completed (a9).

Further, when the plate is removed, it is checked that the plate 2 exists, but the wafer 3 does not exit, and the above operations are made in the reverse order.

That is, first, it is checked that the wafer does not exist on the plate, but the plate 2 exists on the base member (b1 and b2). The conveyance hand 9 is moved to hold the plate side surface (b3), and the grasp mechanism 10 of the conveyance hand 9 is changed to a grasping status (b4). The plate suction mechanism is released to change the plate into unsucked status (b5), and the hand 9 is moved upward by the Z drive mechanism 25, to operate the plate 2 from the base member 1 (b6), into the status as shown in FIG. 4. Thereafter, the plate 2 is conveyed onto the plate carrier (not shown).

Note that the plate 2 is previously processed so as to have an ultra-flat surface when placed on the base member 1. If there is a probability that dust is held between the plate and the base member upon attachment/removal, it is more preferable to provide a function or mechanism to check the flatness after the attachment/removal of the plate.

To correct the wafer-contact surface of the plate 2 to be ultra flat, it is preferable that the base member 1 and the plate 2 respectively have ultra-flat surfaces. Actually, as there is a process limit, it is difficult to attain a complete precision regarding surface distortion. In ultra-flatness processing, precision is obtained by grinding or lapping. In this case, as slight inner stress occurs in the processed workpiece, a thin plate as in the present embodiment is distorted. Note that regarding thickness unevenness, such a problem does not occur. Therefore, high-precision thickness control can be made.

In the present embodiment, the base member 1 has an ultra-flat surface, and the thickness of the plate 2 is controlled, such that the base member 1 flatten-corrects the plate 2. Accordingly, even if the plate 2 itself has slight distortion, the wafer-contact surface of the plate 2 can be corrected to be flat by suctioning the plate 2 to the base member 1. For example, if the surface of both members are vacuum-suctioned to each other in an area of Ø300 mm (the area of the suctioned surfaces is about 707 $cm^2$), the suction can be made by a force of 707 kgf at the maximum, and this force can be utilized for correcting the distortion of the plate.

On the other hand, when the surface of the plate 2 is flatten-corrected by the base member 1, the base member 1 receives a force to distort the base member. However, if the base member is distorted by an amount exceeding the allowable range, the function to correct the flat surface of the wafer is finally degraded.

It is desirable that the rigidity of the base member 1 is greater than that of the plate 2. For example, assuming that the rigidity of the plate 2 is "1", the rigidity of the base member 1 is desirably "2" or greater.

Generally, the focal depth assigned to wafer surface precision in a semiconductor exposure process is 2 μm or less ($\lambda$=0.365, NA=0.3, k=1, and if the assignment to the wafer surface precision is 50%, ($\lambda/NA^2$)×k×0.5), the limitation of the plate flattening process is 4 μm (e.g., Ø150 mm). The relation of rigidity between the plate 2 and the base member 1 is the ratio of rigidity required of the base member 1 in this case (here the surface shape of the base member 1 is ignored for the sake of simple explanation).

Note that the relation between the process precision and the ratio of rigidity (rigidity of plate 2/rigidity of base member 1) and the flatness of the plate 2 after flattening-correction is as follows.

Process precision×rigidity ratio=flatness of plate 2 after flattening-correction.

Accordingly, as a thin plate (e.g., having a thickness of a wafer) is generated, even if the plate 2 has distortion, the contact surface of the plate 2 can be ultra flat by suction-holding the plate to the base member having sufficient rigidity.

Note that even if the focal depth is reduced in the future, the flattening-correction can be made by increasing the rigidity of the base member with respect to the plate rigidity. Further, if the base member has a rigidity higher than that of the plate, the flatness of the flatten-corrected plate 2 can be increased. Desirably, assuming that the rigidity of the plate 2 is "1", the rigidity of the base member 1 is "10" or greater. More desirably, assuming that the rigidity of the plate 2 is "1", the rigidity of the base member 1 is "20" or greater.

Note that the plate 2 is removed from the base member in accordance with a predetermined sequence. As timing of the removal of the plate 2 from the base member 1, ① when contamination of the plate is detected and the contamination level is higher than a predetermined reference level, the plate is removed to be exchanged with another plate; ② when a predetermined period has elapsed since the plate was set on the base member, the plate is removed to be exchanged with another plate; or ③ when the substrate holding device is applied to an aligner, the plate is removed in accordance with an exposure history.

Foreign materials attached to the plate 2 are removed by a cleaner (not shown), and the plate 2 is reused. Further, it is desirable to provide a device to detect foreign materials attached to the plate to be utilized, and it is further desirable to provide a device to detect smoothness, flaws, and the like, of the plate.

Note that if another plate is used while the removed plate is cleaned, production is continued without suspension during the cleaning.

Further, as the projections of the base member 1 are to be positioned under the projections of the plate 2, the plate 2 must be aligned with the base member 1. Accordingly, similar to a notch 18 of the wafer or an orientation/flat aligner, an alignment reference mark 19 such as a notch or orientation/flat aligner is formed in the plate such that alignment is made upon conveyance of the plate as in the case of a wafer. Note that the alignment between the plate 2 and the base member 1 is not limited to this method, but any other alignment reference mark may be provided. For example, an alignment mark may be formed on the plate 2, or a target for magnetic detection may be provided to detect the relative position of the plate 2 to the base member, or the plate 2 may have an edge so as to be measured from the base member 1. In this case, it is desirable to provide a sensor to detect the alignment reference mark. Note that the sensor may be provided on the base member 1.

Further, it is more desirable that in consideration of a process where local surface precision of the plate influences pattern precision, plates used in exposure are managed by a barcode or an inscription. Note that management is not only made by a barcode or an inscription, but may be made by any sign for identifying the plate. In this case, it is necessary to provide an identification sensor to identify the sign provided on the plate. Further, it is desirable to provide a storage device for storing a status of use of a plate based on an identification signal from the identification sensor. Then, based on information stored in the storage device, the controller 21 controls an exposure process and other processes.

Further, as the plate 2 is brought in direct contact with the wafer, the plate is desirably made of a ceramic (e.g., SiC, SiN) material. Further, the substrate holding base member to hold the plate 2 is desirably made of a ceramic material.

As to a temperature difference between the plate 2 that has been conveyed from outside of the exposure chamber and the apparatus, a cooling mechanism (cooling channel 6) included in the base member 1 performs temperature control in a short period. Note that to effectively control the temperature of the plate 2 by the base member 1, thermal transfer from the base member 1 to the plate 2 can be increased by filling gas in the space suctioning both members to each other. That is, the pressure of the gap between the base member 1 and the plate 2 is controlled to an extent to which the plate 2 can be suctioned, so as not to attain a vacuum state where almost no gas exists in the gap. For this purpose, to control the pressure of the gap between the base member 1 and the plate 2, the plate suction mechanism 4 desirably has a pressure regulating mechanism (not shown) and a pressure sensor (not shown). The controller 21 inputs a signal regarding the pressure outputted from the pressure sensor, and controls the pressure regulating mechanism based on the pressure signal. As the pressure regulating mechanism, a throttle, or the like, can be used. The pressure can be controlled by controlling the opening area of the throttle.

Next, upon placement of the wafer from this state, the wafer is conveyed by a conveyance device (not shown) from the wafer carrier (not shown) in a similar manner to that of the conveyance of the plate 2.

The wafer 3 is conveyed to a position above the plate 2, then the wafer is moved downward by the Z drive mechanism 25, into contact with the plate 2. When the contact has been checked, both members are suction-held by changing the wafer suction mechanism 5 in FIG. 1 to a suctioning status. The wafer and the plate are suction-held by vacuum suction.

When the suction status has been checked, the grasp mechanism 10 in the hand 9 is changed to a non-grasping status, and the hand 9 withdraws, thus plate placement is completed. Further, when the wafer is removed, the above operation is made in the reverse order.

Note that the plate 2 and the wafer 3 are conveyed by the same conveyance device. However, they may be conveyed by different conveyance devices depending on the system.

In the present invention, the plate, which may be contaminated due to attachment of photosensitive material, or the like, upon contact with the wafer, can be replaced with another plate. Accordingly, in comparison with the conventional art, the time to remove the contaminants is not required, and the productivity can be improved.

Further, as the plate on the flat plate can be removed, cleaning to remove the contaminants can be easily made.

<Second Embodiment>

Figure 6:
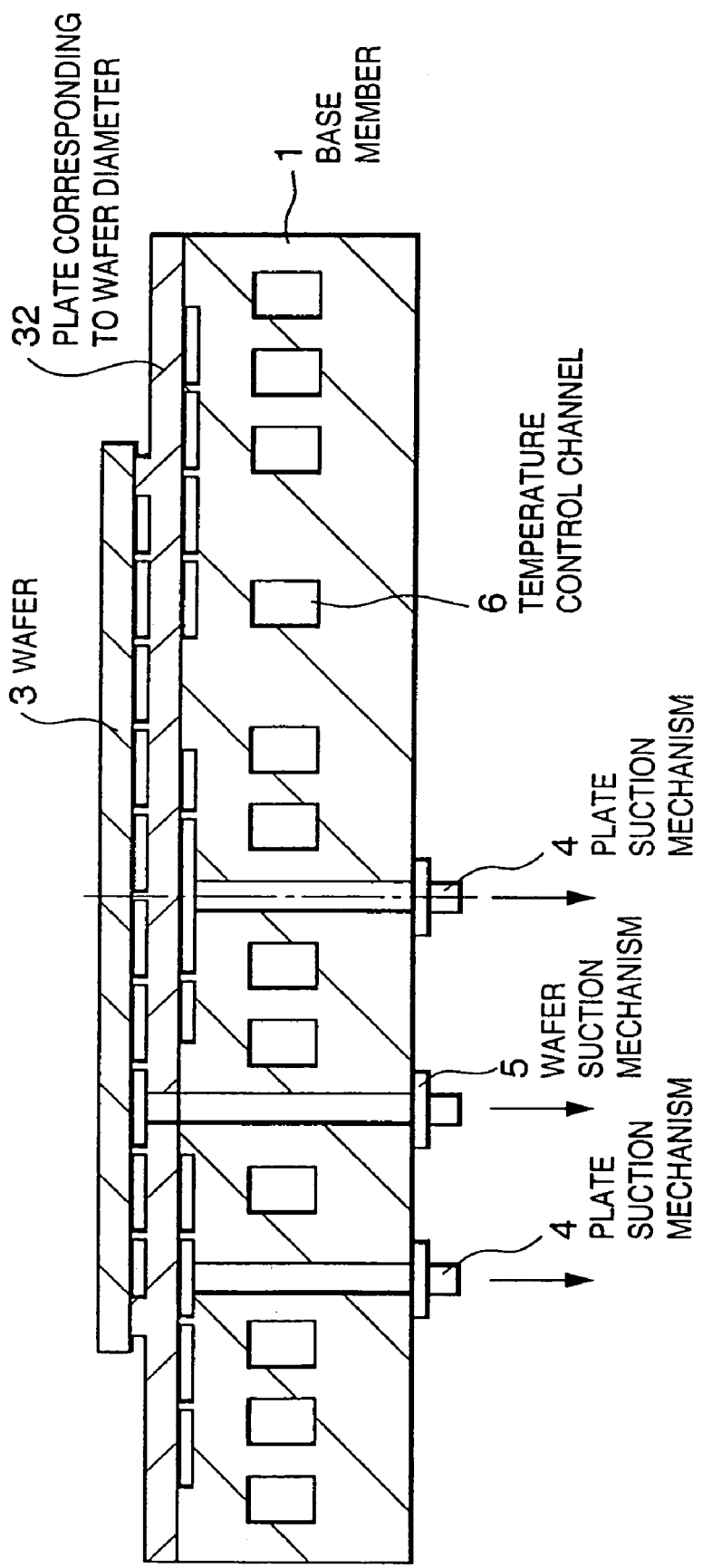
FIG. 6 is a cross-sectional view of the substrate holding device according to a second embodiment of the present invention.

FIG. 6 is a cross-sectional view showing the structure of the substrate holding device (wafer chuck) of the semiconductor manufacturing apparatus according to a second embodiment of the present invention.

The second embodiment uses a plate 32 corresponding to the wafer diameter.

In a case where wafers having different diameters such as a φ300 mm (12 inch) wafer and a φ200 mm (8 inch) wafer are exposed by a single apparatus, conventionally, a wafer chuck for the φ300 mm wafer must be exchanged with a wafer chuck for the φ200 mm wafer. On the other hand, in the present embodiment, wafers having various diameters can be handled only by changing the plate shape to have a convexity as shown in FIG. 6. That is, in the present embodiment, the area of the plate to suction-hold can be changed by appropriately changing the plate.

If only the plate 32 is changed in correspondence with the wafer diameter that is changed, automatic exchange by the conveyance mechanism as shown in FIG. 4 can be realized, thus working time can be greatly reduced.

That is, the type of wafer to be held is specified from an exposure condition inputted into the controller 21 or stored in the memory (not shown) of the controller 21. Then, the controller 21 designates a plate to be sucked on the base member 1 based on the specified wafer type. The identification of the plate at this time may be made by using an identification sign such as a barcode provided on the plate. Note that attachment/removal of the plate thereafter is made in the same manner as that described in the first embodiment.

Although the vacuum suction is used as an attraction mechanism of the base member 1 and the plate 2 (34) in the above first and second embodiments, other mechanisms, such as electrostatic attraction, magnetic attraction and mechanical fixing, may be used.

<Third Embodiment>

Figure 7:
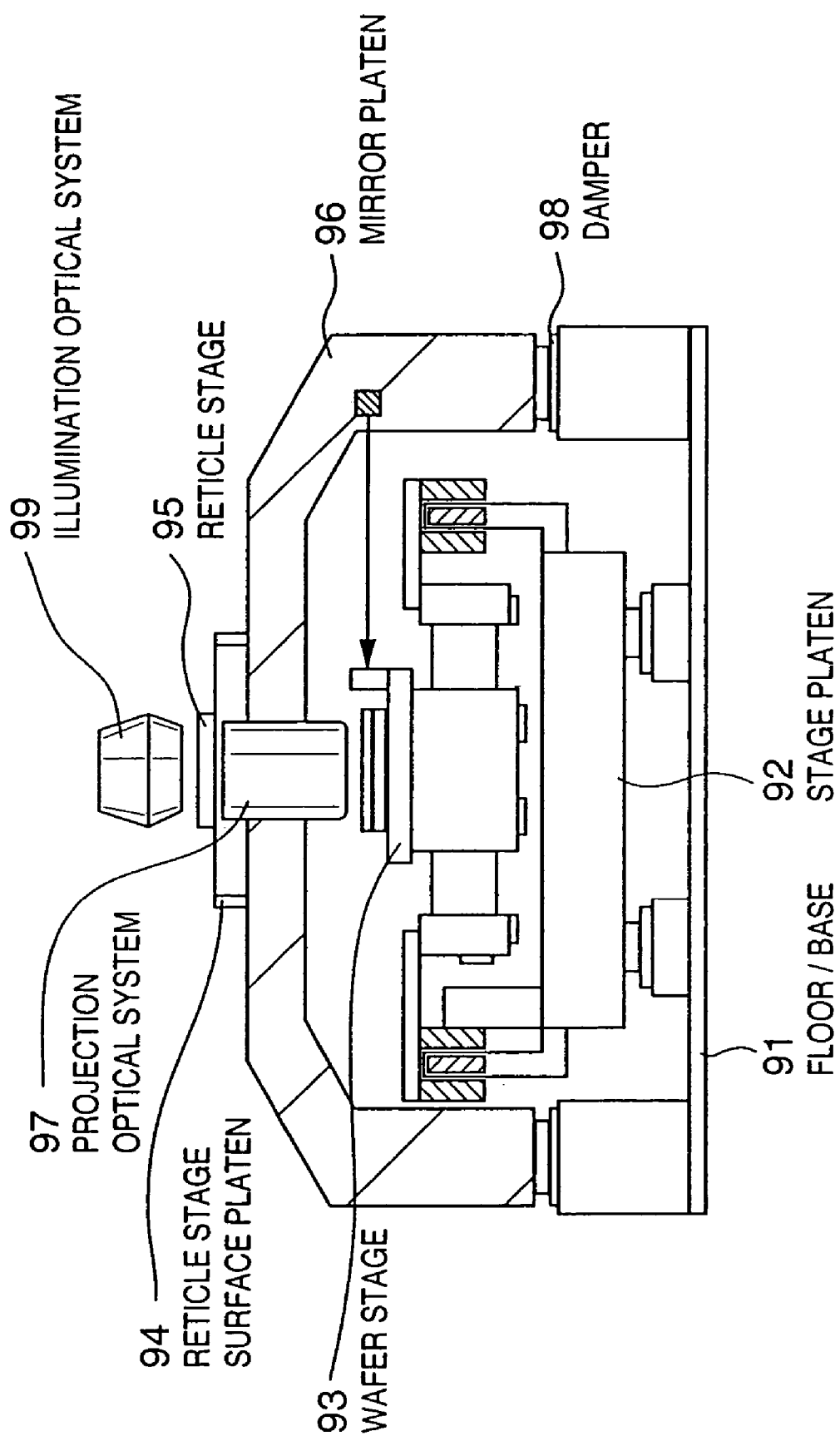
FIG. 7 is a schematic view of a semiconductor aligner according to a third embodiment of the present invention.

Next, an embodiment of a scanning aligner in which the substrate holding device of the first or second embodiment is mounted on a wafer stage will be described with reference to FIG. 7.

A mirror plate 96 is supported by a floor or base 91 via a damper 98. Further, the mirror platen 96 supports a reticle stage platen 94 and supports a projection optical system 97 positioned between a reticle stage 95 and a wafer stage 93.

The wafer stage 93 is supported on a stage platen 92 supported by the floor or base 91, for carrying and positioning the wafer. Further, the reticle stage 95, supported on the reticle stage plate 94 supported by the mirror platen 96, is movable while carrying a reticle having a circuit pattern. Exposure light to expose the reticle mounted on the reticle stage 95 is emitted from an illumination optical system 99.

Note that the wafer stage 93 is scanned in synchronization with the reticle stage 95. While the reticle stage 95 and the wafer stage 93 are scanned, the positions of these stages are continuously detected respectively by interferometers, and fed back to driving units of the reticle stage 95 and the wafer stage 93. This attains accurate synchronization between the scan start positions of these stages and high-precision control on scanning speed in a constant-speed scan area. While these stages are scanned with respect to the projection optical system 97, the reticle pattern is exposed and, thus, the circuit pattern is transferred onto the wafer.

<Fourth Embodiment>

Figure 8:
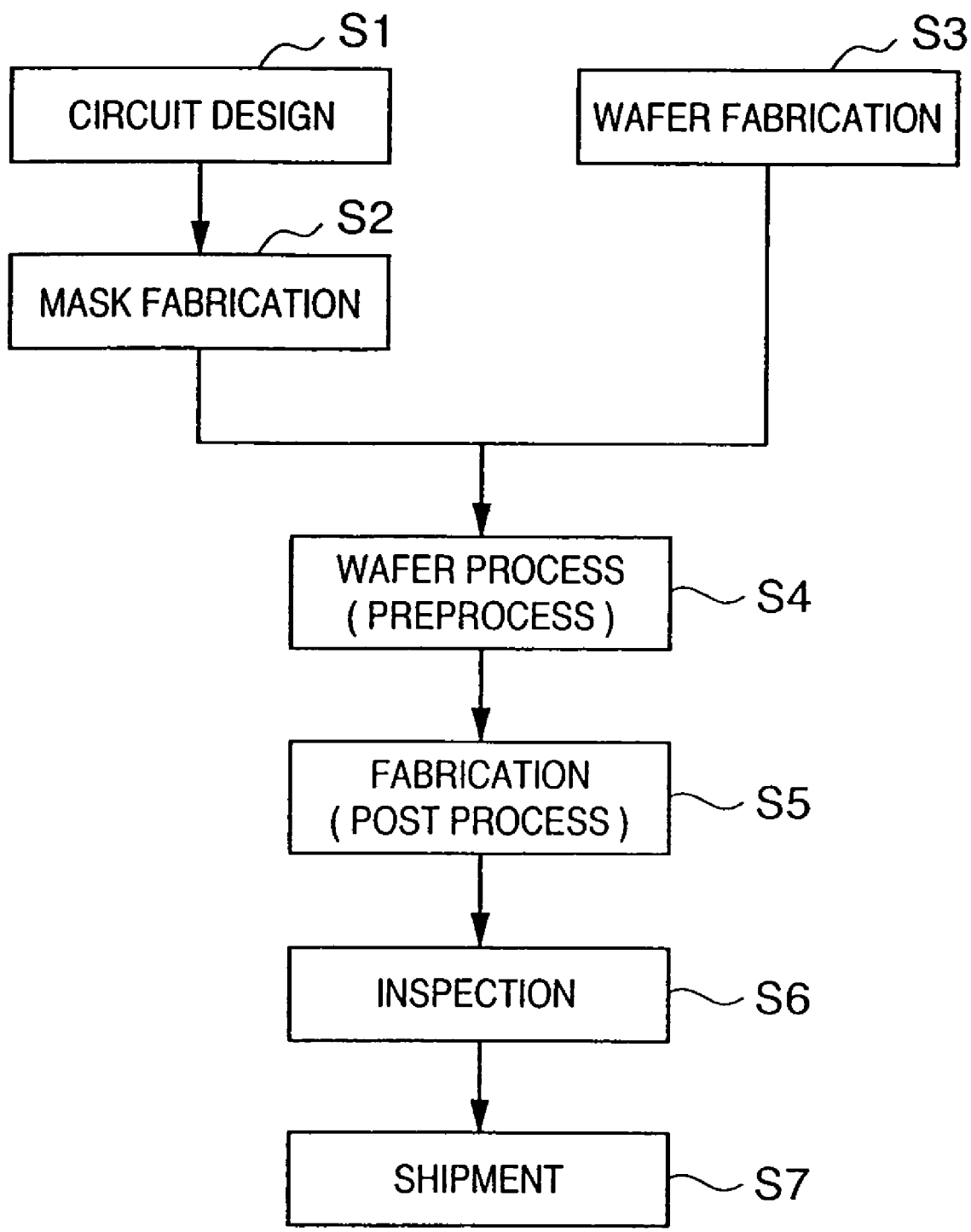
FIG. 8 is a flowchart showing semiconductor device fabrication.

Next, an embodiment of the semiconductor device manufacturing method utilizing the above aligner will be described. FIG. 8 shows a flow of a fabrication of a semiconductor device (e.g., a semiconductor chip, such as an IC or an LSI, or a liquid crystal panel, a CCD, or the like). At step S1 (circuit design), a circuit design of the semiconductor device is made. At step S2 (mask fabrication), a mask where the designed circuit pattern is formed is fabricated. At step S3 (wafer fabrication), a wafer is fabricated by using material such as silicon. At step S4 (wafer process), called a preprocess, the mask and the wafer are used for forming an actual circuit on the wafer by lithography. At step S5 (fabrication), called a post process, the wafer fabricated at step S4 is used for forming a semiconductor chip. The step S5 includes an assembly process (dicing and bonding), a packaging process (chip encapsulation), and the like. At step S6 (inspection), inspections such as an operation test and an endurance test are performed on the semiconductor device fabricated at step S5. Through these processes, the semiconductor device is completed and shipped (step S7).

Figure 9:
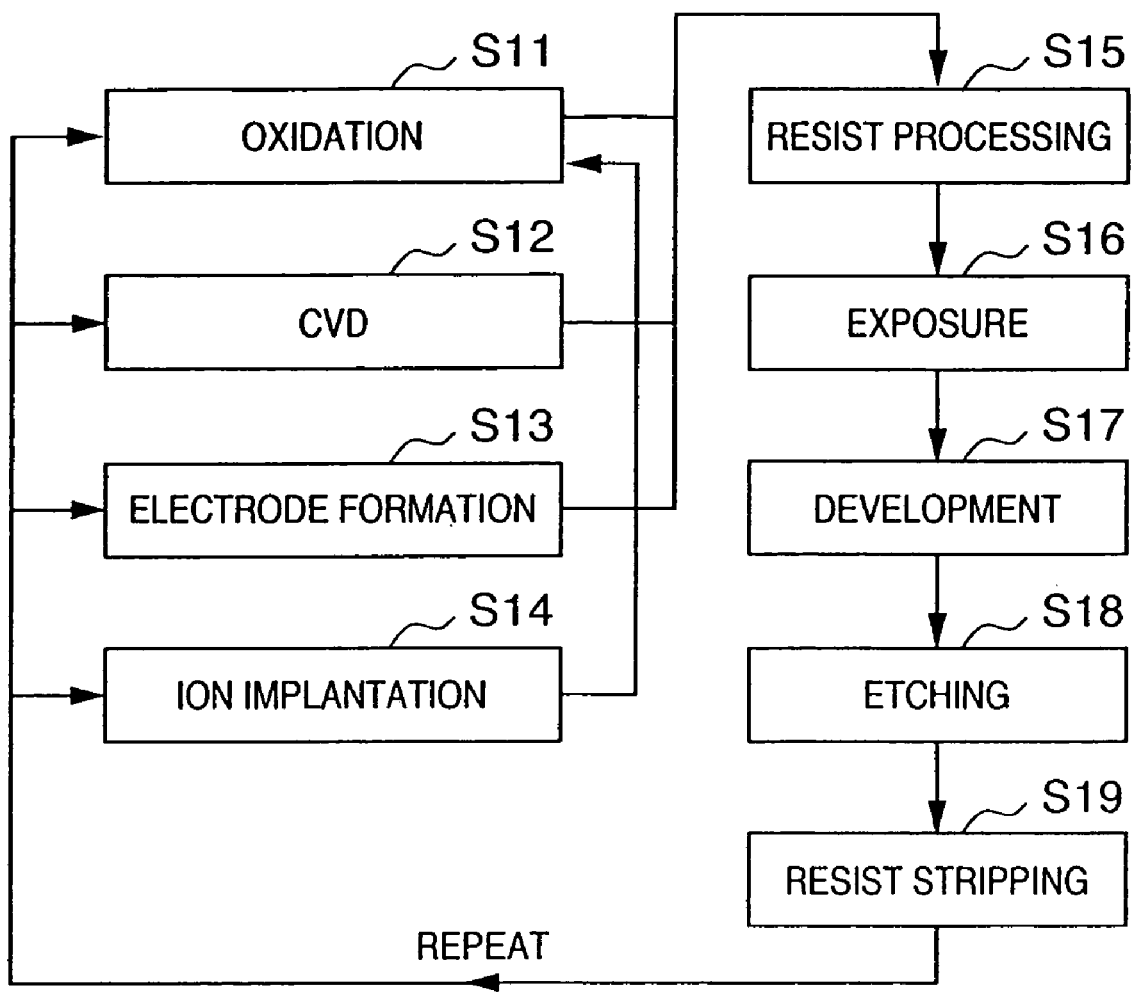
FIG. 9 is a flowchart showing a wafer process.
Figure 10:
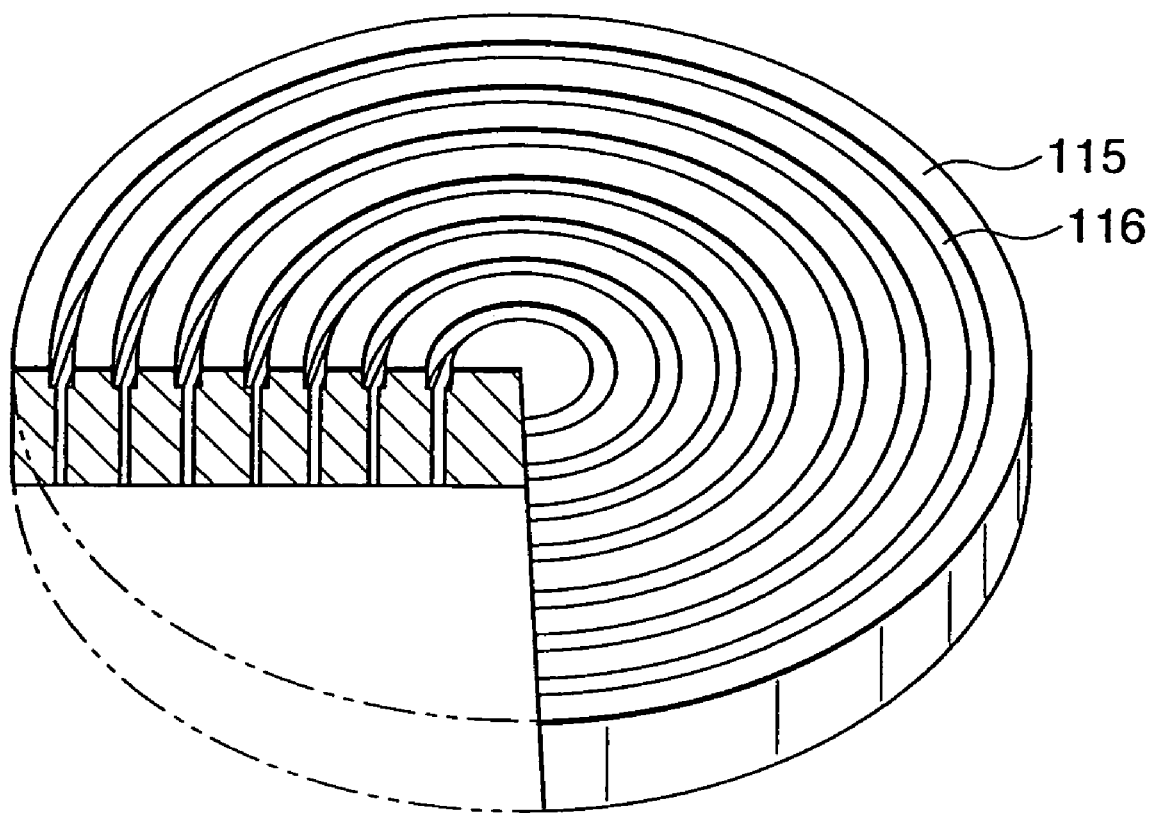
FIG. 10 is a partial-cutaway schematic perspective view of the conventional substrate holding device.

FIG. 9 shows the wafer process in detail. At step S11 (oxidation), the surface of the wafer is oxidized. At step S12 (CVD), an insulating film is formed on the surface of the wafer. At step S13 (electrode formation), an electrode is formed by vapor-deposition on the wafer. At step S14 (ion implantation), ions are implanted into the wafer. At step S15 (resist processing), a photoresist is applied to the wafer. At step S16 (exposure), the circuit pattern on the mask is expose-printed on the wafer by the above aligner. At step S17 (development), the exposed wafer is developed. At step S18 (etching), the portions other than the developed resist image are removed. At step S19 (resist stripping), the unnecessary resist after the etching was removed. These steps are repeated until a multiple circuit pattern is formed on the wafer. By using the fabrication method of the present embodiment, the conventionally low-efficient device fabrication process can be improved.

According to the substrate holding device of the present invention, as the plate can be removed and cleaned, time to remove contaminants is not required. Thus, the productivity can be improved. Further, as the plate on the flat plate can be removed, cleaning to remove the contaminants can be easily performed.

The present invention is not limited to the above embodiments and various changes and modifications can be made within the spirit and scope of the present invention. Therefore, to apprise the public of the scope of the present invention, the following claims are made.

The invention claimed is:

1. An exposure apparatus for performing an exposure of a substrate to a pattern, said apparatus comprising:
    a base member configured to removably hold a plate, the plate having an identification sign and a contact portion configured to come into contact with the substrate;
    a sensor configured to identify the identification sign to identify a designated plate; and
    a conveyance mechanism configured to convey the identified plate to said base member.

2. An apparatus according to claim 1, further comprising a storage configured to store information concerning the status of use of the plate based on an identification signal from said sensor.

3. An apparatus according to claim 1, further comprising a controller configured to designate a plate to be held by said base member as the designated plate based on a condition of the exposure to be performed.

4. A method of manufacturing a device, said method comprising steps of:
    exposing a substrate to a pattern using an exposure apparatus as defined in claim 1;
    developing the exposed substrate; and
    processing the developed substrate to manufacture the device.

5. An exposure apparatus for exposing a substrate to a pattern, said apparatus comprising:

a base member configured to removably hold a plate, the plate having an identification sign and a contact portion configured to come into contact with the substrate;

a sensor configured to identify the identification sign to identify the plate;

a storage configured to store information concerning the status of use of the plate;

a controller configured to cause said storage to store the information based on an identification signal from said sensor; and a conveyance mechanism configured to convey the plate to perform replacement of a plate held by said base member with another plate, wherein said controller is further configured to instruct said conveyance mechanism to perform the replacement based on the stored information.

* * * * *

UNITED STATES PATENT AND TRADEMARK OFFICE
CERTIFICATE OF CORRECTION

PATENT NO.        : 7,102,735 B2                                      Page 1 of 1
APPLICATION NO.   : 11/220677
DATED             : September 5, 2006
INVENTOR(S)       : Shin Matsui It is certified that error appears in the above-identified patent and that said Letters Patent is hereby corrected as shown below:

COLUMN 3:
        Line 57, the second occurrence of "is" should read -- be --.

COLUMN 4:
        Line 39, "[are]" should be deleted.
        Line 43, "are" should read -- be --.
        Line 44, "means" should read -- mean --.
        Line 60, "are" should read -- be --.
        Line 63, "are" should read -- be --.

COLUMN 6:
        Line 9, "exit," should read -- exist, --.
        Line 55, the second occurrence of "is" should read -- be --.

COLUMN 7:
        Line 61, "are" should read -- be --.

COLUMN 9:
        Line 33, "plate" should read -- platen --.

Signed and Sealed this

Third Day of April, 2007

JON W. DUDAS
*Director of the United States Patent and Trademark Office*